United States Patent
Milner et al.

(10) Patent No.: US 12,506,472 B2
(45) Date of Patent: Dec. 23, 2025

(54) HIGH POWER SWITCHING CIRCUIT WITH INTEGRATED BOOT STRAP DIODE

(71) Applicant: Infineon Technologies Canada Inc., Ottawa (CA)

(72) Inventors: Lucas Andrew Milner, Sunnyvale, CA (US); Ramesh G. Karpur, Bangalore (IN); Abhishek Jain, Delhi (IN)

(73) Assignee: Infineon Technologies Canada Inc., Ottawa (CA)

( * ) Notice: Subject to any disclaimer, the term of this patent is extended or adjusted under 35 U.S.C. 154(b) by 51 days.

(21) Appl. No.: 18/423,042

(22) Filed: Jan. 25, 2024

(65) Prior Publication Data

US 2025/0247087 A1    Jul. 31, 2025

(51) Int. Cl.
*H03K 17/06* (2006.01)
*H03K 17/687* (2006.01)

(52) U.S. Cl.
CPC ....... *H03K 17/063* (2013.01); *H03K 17/6871* (2013.01); *H03K 2217/0063* (2013.01); *H03K 2217/0072* (2013.01)

(58) Field of Classification Search
CPC ............. H03K 17/063; H03K 17/6871; H03K 2217/0063; H03K 2217/0072
See application file for complete search history.

(56) References Cited

U.S. PATENT DOCUMENTS

| | | | |
|---|---|---|---|
| 9,954,422 B2 * | 4/2018 | Oljaca | H02M 3/07 |
| 2008/0290841 A1 * | 11/2008 | Chang | H02J 7/345 |
| | | | 320/166 |
| 2022/0376100 A1 * | 11/2022 | Yang | H10D 30/475 |

* cited by examiner

*Primary Examiner* — Metasebia T Retebo
(74) *Attorney, Agent, or Firm* — WORKMAN NYDEGGER

(57) ABSTRACT

A circuit for providing an alternating signal to a switching node. The circuit includes three power transistors, two capacitors, and two gate drivers. The first and second transistors are connected in series, with the switching node connected therebetween. When the first transistor is on and the second transistor is off, a high voltage is provided to the switching node via the first transistor. When the first transistor is off and the second transistor is on, a low voltage is provided to the switching node via the second transistor. The transistors are controlled via the gate drivers. Charge is provided to the gate drivers via the capacitors. The capacitors are charged via an intermediate power source, with the third power transistor connected in diode configuration between the two capacitors. The circuit is capable of withstanding high voltage differences across the transistors, and may be implemented monolithically on a same epitaxial stack.

7 Claims, 2 Drawing Sheets

HIGH POWER SWITCHING CIRCUIT WITH INTEGRATED BOOT STRAP DIODE

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current—hence the term "field-effect transistor".

Silicon has traditionally been used to fabricate transistors. However, wider bandgap semiconductor material may be used to fabricate transistors that conduct higher power and operate at higher efficiency than silicon transistors. Silicon carbide (SiC), Aluminum Nitride (AlN), Zinc Oxide (ZnO), and Gallium Nitride (GaN) are each examples of wide bandgap semiconductor materials that can be used in power electronics. One way to use such wider bandgap semiconductor materials is to form two layers of different semiconductor materials to therebetween form a heterojunction.

These two semiconductor materials may have sufficiently different bandgaps such that when brought together, the joined bandgap drops below the Fermi level just within the channel layer. This means that electrons may freely flow within this region. This region is thin in depth and forms a plane parallel to the upper surface of the channel region. Thus, this region is called a "2DEG" region to emphasize its planar form. Furthermore, this region is also referred to as a 2DEG "sea of electrons" due to the high mobility of electrons in this region. Thus, the 2DEG region is highly conductive. The 2DEG region may form the channel region of a power semiconductor to allow passage of high currents with relatively low resistance. Field-effect transistors that use such a 2DEG are referred to as "High-Electron-Mobility Transistors" (or HEMTs).

The subject matter claimed herein is not limited to embodiments that solve any disadvantages or that operate only in environments such as those described above. Rather, this background is only provided to illustrate one example technology area where some embodiments described herein may be practiced.

SUMMARY

Embodiments described herein relate to a switching circuit for providing an alternating signal. The switching circuit may be used to control high voltages and high currents, and may also be implemented monolithically on the same chip, thus allowing the circuit to be compact. As an example only, the alternating signal may alternate between a high voltage (e.g., hundreds of volts), and a low voltage (e.g., ground). The circuit includes two power transistors connected in series, between a high-voltage power source (e.g., providing hundreds of volts) and a low-voltage power source (e.g., providing ground). The power transistor connected to the high-voltage power source may be referred to as the "high" power transistor, and the power transistor connected to the lower power source may be referred to as the "low" power transistor.

Thus, by alternating which of the power transistors is on and off, an alternating signal is applied to an output node of the switching circuit, which is between the two power transistors. The high power transistor has a gate driver (referred to as the "high" gate driver) that controls whether the high power transistor is on or off. On the other hand, the low power transistor has a low gate driver (referred to as the "low" gate driver) that controls whether the low power transistor is on or off. One capacitor (a "high" capacitor) is connected between upper and lower voltage supply nodes of the high gate driver. Another capacitor (a "low" capacitor) is connected between upper and lower voltage supply nodes of the low gate driver. The capacitor for the respective gate driver operates so as to maintain a consistent voltage difference between the upper and lower voltage supply nodes of the respective gate driver.

To charge the low capacitor, an intermediate power source (e.g., providing positive 6 volts, or what is sometimes referred to as a Vdd) is connected to the upper voltage supply node of the low gate driver and to an upper terminal of the low capacitor. Furthermore, the low-voltage power source (e.g., ground, or what is sometimes referred to as Vss) is connected to the lower voltage supply node of the low gate driver. Accordingly, the low gate driver is powered.

On the other hand, the high capacitor is used to provide a stable voltage difference between the upper voltage supply node and the lower supply node of the high gate driver. The lower voltage supply node of the high gate driver is connected to the lower terminal of the high capacitor and to the output node of the switching circuit. Thus, an alternating signal is provided to the lower voltage supply node of the high gate driver. This is fine as long as the voltage at the upper voltage supply node is also alternating in like fashion so as to maintain the proper voltage difference. This is accomplished by having the upper terminal of the high capacitor connected to the upper voltage supply node of the high gate driver, and also by having a third power transistor connected in diode configuration with a forward-biased direction from the intermediate power source to the upper terminal of the high capacitor.

Accordingly, during switching deadtime while both of the high power transistor and the low power transistor are off, the upper terminal of the high capacitor receives charge from the intermediate power source via the forward-biased third power transistor. On the other hand, when the alternating signal provided at the output node of the switching circuit is high, the third power transistor is reversed-biased with high voltage difference that is quite high, on the order of the difference between the high-voltage power source (e.g., providing hundreds of volts) and the low-voltage power source (e.g., providing ground). However, the third power transistor can withstand such high reversed-biased voltage differences.

This ability to withstand such high reverse-biased voltage may be accomplished by having each of the three power transistors made of semiconductor materials (e.g., Gallium-Nitride) that allow for high voltage differences between their respective drain nodes and source nodes. Further, each of the power transistors may be made of the same semiconductor materials, and thus may also be constructed monolithically in the same epitaxial stack. In some embodiments, the gate drivers and the capacitors may also be constructed on this same epitaxial stack. Accordingly, the circuit (or at least much of the circuit) may be constructed monolithically, and therefore may be compact, while allowing the circuit to manage high voltages and currents.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the circuits, systems, and methods described herein can be obtained, a more particular description of the embodiments briefly described herein will be rendered by reference to specific embodiments thereof which are illustrated in the appended drawings. Understanding that these drawings depict only typical embodiments of the circuits, systems and methods described herein, and are not therefore to be considered to be limiting of their scope, certain circuits, systems and methods will be described and explained with additional specificity and detail through the use of the accompanying drawings in which.

DETAILED DESCRIPTION

Figure 1:
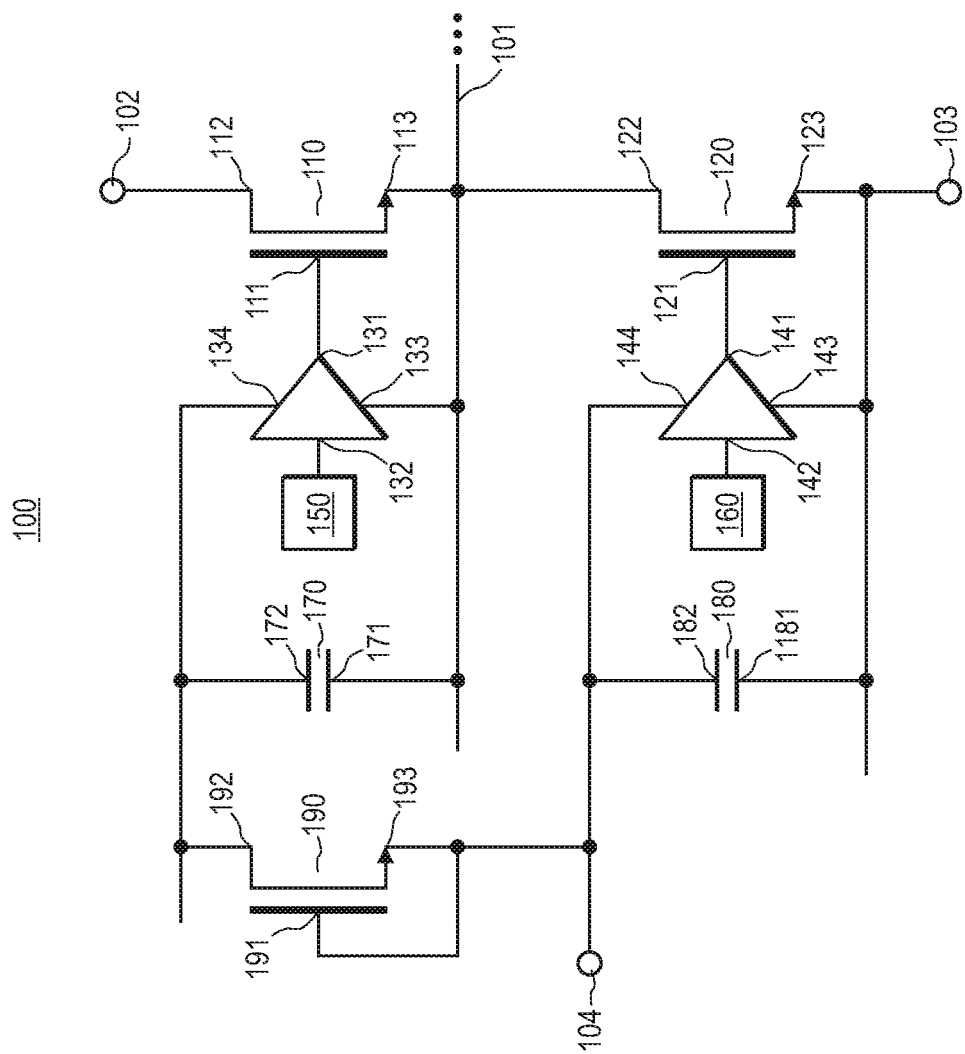
FIG. 1 illustrates a switching circuit in which the principles described herein may be practiced, and is just one example of a circuit that is consistent with the principles described herein.

Embodiments described herein relate to a switching circuit for providing an alternating signal. The switching circuit may be used to control high voltages and high currents, and may also be implemented monolithically on the same chip, thus allowing the circuit to be compact. As an example only, the alternating signal may alternate between a high voltage (e.g., hundreds of volts), and a low voltage (e.g., ground). The circuit includes two power transistors connected in series, between a high-voltage power source (e.g., providing hundreds of volts) and a low-voltage power source (e.g., providing ground). The power transistor connected to the high-voltage power source may be referred to as the "high" power transistor, and the power transistor connected to the lower power source may be referred to as the "low" power transistor.

Thus, by alternating which of the power transistors is on and off, an alternating signal is applied to an output node of the switching circuit, which is between the two power transistors. The high power transistor has a gate driver (referred to as the "high" gate driver) that controls whether the high power transistor is on or off. On the other hand, the low power transistor has a low gate driver (referred to as the "low" gate driver) that controls whether the low power transistor is on or off. One capacitor (a "high" capacitor) is connected between upper and lower voltage supply nodes of the high gate driver. Another capacitor (a "low" capacitor) is connected between upper and lower voltage supply nodes of the low gate driver. The capacitor for the respective gate driver operates so as to maintain a consistent voltage difference between the upper and lower voltage supply nodes of the respective gate driver.

To charge the low capacitor, an intermediate power source (e.g., providing positive 6 volts, or what is sometimes referred to as a Vdd) is connected to the upper voltage supply node of the low gate driver and to an upper terminal of the low capacitor. Furthermore, the low-voltage power source (e.g., ground, or what is sometimes referred to as Vss) is connected to the lower voltage supply node of the low gate driver. Accordingly, the low gate driver is powered.

On the other hand, the high capacitor is used to provide a stable voltage difference between the upper voltage supply node and the lower supply node of the high gate driver. The lower voltage supply node of the high gate driver is connected to the lower terminal of the high capacitor and to the output node of the switching circuit. Thus, an alternating signal is provided to the lower voltage supply node of the high gate driver. This is fine as long as the voltage at the upper voltage supply node is also alternating in like fashion so as to maintain the proper voltage difference f. This is accomplished by having the upper terminal of the high capacitor connected to the upper voltage supply node of the high gate driver, and also by having a third power transistor connected in diode configuration with a forward-biased direction from the intermediate power source to the upper terminal of the high capacitor.

Accordingly, during switching deadtime while both of the high power transistor and the low power transistor are off, the upper terminal of the high capacitor receives charge from the intermediate power source via the forward-biased third power transistor. On the other hand, when the alternating signal provided at the output node of the switching circuit is high, the third power transistor is reversed-biased with high voltage difference that is quite high, on the order of the difference between the high-voltage power source (e.g., providing hundreds of volts) and the low-voltage power source (e.g., providing ground). However, the third power transistor can withstand such high reversed-biased voltage differences.

This ability to withstand such high reverse-biased voltage may be accomplished by having each of the three power transistors made of semiconductor materials (e.g., Gallium-Nitride) that allow for high voltage differences between their respective drain nodes and source nodes. Further, each of the power transistors may be made of the same semiconductor materials, and thus may also be constructed monolithically in the same epitaxial stack. In some embodiments, the gate drivers and the capacitors may also be constructed on this same epitaxial stack. Accordingly, the circuit (or at least much of the circuit) may be constructed monolithically, and therefore may be compact, while allowing the circuit to manage high voltages and currents.

FIG. 1 illustrates a switching circuit 100 in which the principles described herein may be practiced, and is just one example of a circuit that is consistent with the principles described herein. The switching circuit 100 provides an alternating signal on an output node 101. As an example only, the alternating signal may alternate between a high voltage (e.g., hundreds of volts) and a low voltage (e.g., ground). The switching circuit 100 includes two power transistors 110 and 120 connected in series, with the output node 101 connected therebetween.

The power transistor 110 has a gate node 111 that controls whether current flows between a drain node 112 and a source node 113 of the power transistor 110. Likewise, the power transistor 120 has a gate node 121 that controls whether current flows between a drain node 122 and a source node 123 of the power transistor 120. In this description, and in the claims, a "power transistor" is a transistor that is capable of transmitting more than 1 Watt of power when on. In one example, each of the power transistors 110 and 120 may be field-effect transistors that are capable of having a drain-to-source voltage (when off) of at least 50 volts. However, the principles described herein are not limited to the power transistors 110 and 120 being any particular kind of transistor. The source node 113 of the power transistor 110 and the drain node 122 of the power transistor 120 are connected together, with the output node 101 connected therebetween. As an example, an external device (not shown) may be connected to the output node 101, and may thus draw charge from the output node 101.

As previously stated, the switching circuit 100 is configured to provide an alternating signal on the output node 101. The alternating signal provided to the output node 101 may alternate between a high voltage (e.g., hundreds of volts) and a low voltage (e.g., ground). To accomplish this, power sources may be connected to power terminals 102 and 103 of the switching circuit 100. More specifically, a high-voltage power source (e.g., providing hundreds of volts) may be connected to the drain node 112 of the power transistor 110 via power terminal 102. Thus, the power transistor 110 may be referred to herein as the "high" power transistor 110. Further, a low-voltage power source (e.g., providing ground) may be connected to the source node 123 of the power transistor 120 via power terminal 103. Thus, the power transistor 120 may be referred to herein as the "low" power transistor 120. Furthermore, to prevent confusion, the "high" power transistor 110 will be hereinafter referred to simply as the "high transistor", and the "low" power transistor 120 will be referred to hereinafter as simply the "low transistor."

In any case, when the high transistor 110 is on and the low transistor 120 is off, the high-voltage power source provides the high voltage to the output node 101 via the high transistor 110. On the other hand, when the high transistor 110 is off and the low transistor 120 is on, the low-voltage power source provides the low voltage to the output node 101 via the low transistor 120.

The switching circuit 100 further includes two gate drivers 130 and 140. The gate driver 130 controls the on-off state of the high transistor 110 and is thus called the "high" gate driver 130 herein. Similarly, the gate driver 140 controls the on-off state of the low transistor 120 and is thus called the "low" gate driver 140 herein. More specifically, the high gate driver 130 has an output node 131 connected to the gate node 111 of the high transistor 110. Likewise, the low gate driver 140 has an output node 141 connected to the gate node 121 of the low transistor 120.

Figure 2:
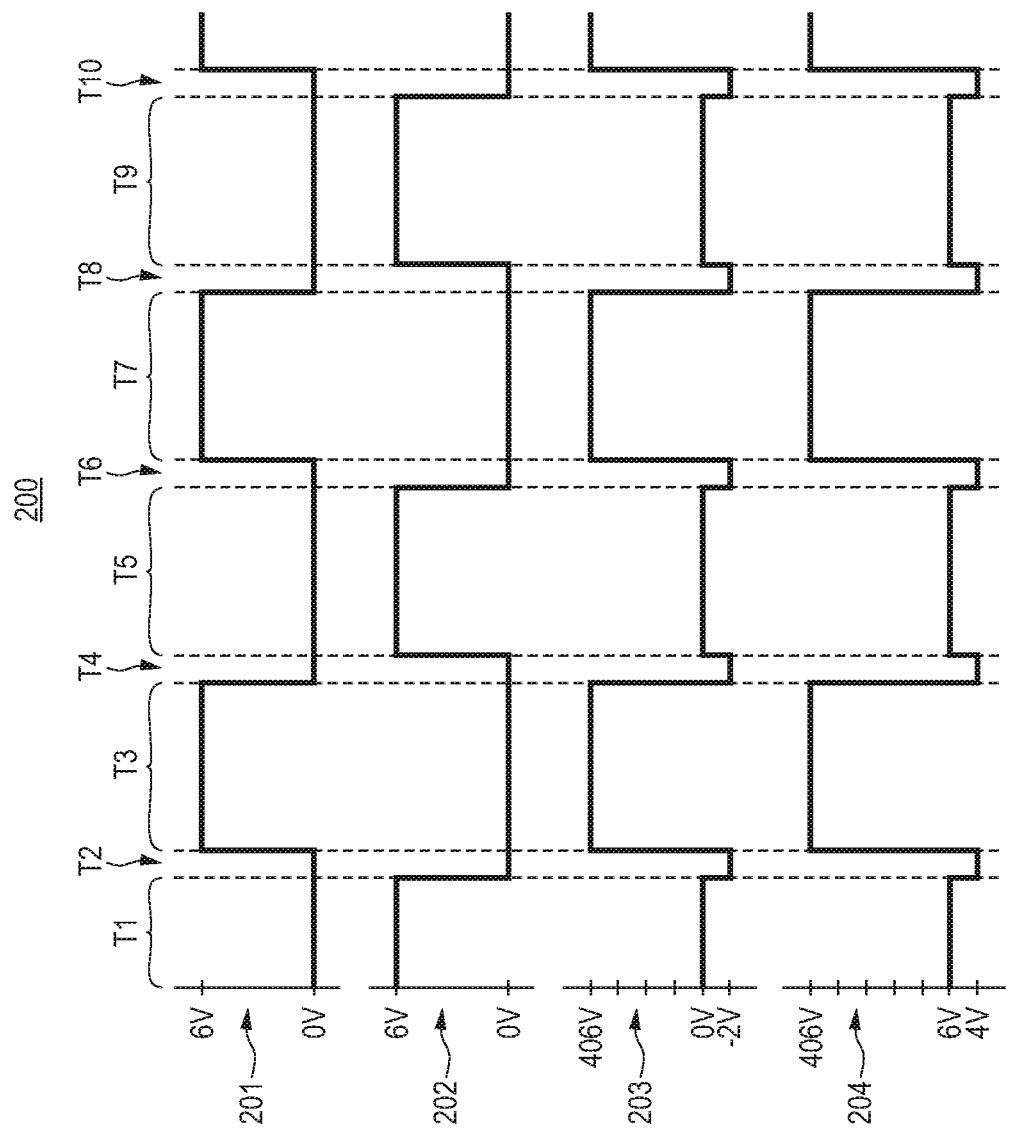
FIG. 2 illustrates a signal diagrams chart, which shows an example of signals representing voltages at various locations in the switching circuit of FIG. 1.

As illustrated, a controller 150 provides input signals to the high gate driver 130 via a data input node 132, which then causes the high transistor 110 to be on or off. Likewise, a controller 160 provides input signals to the low gate driver 140 via a data input node 142, which then causes the low transistor 120 to be on or off. The controllers 150 and 160 jointly coordinate switching of each of the high transistor 110 and the low transistor 120, and may be considered a single controller. An example of such coordination is illustrated in FIG. 2, discussed further below.

The switching circuit 100 also includes two capacitors 170 and 180. The capacitor 170 is connected between voltage supply nodes of the high gate driver 130, and is thus called the "high" capacitor 170 herein. The capacitor 180 is connected between voltage supply nodes of the low gate driver 140, and is thus called the "low" capacitor 180 herein. Specifically, the high capacitor 170 is connected between a lower voltage supply node 133 and an upper voltage supply node 134 of the high gate driver 130. The high capacitor 170 is charged so as to maintain a relatively constant voltage difference between the upper voltage supply node 134 and the lower voltage supply node 133 of the high gate driver 130, thus powering the high gate driver 130. The low capacitor 180 is connected between a lower voltage supply node 143 and an upper voltage supply node 144 of the low gate driver 140. Similarly, the low capacitor 180 is charged so as to maintain a relatively constant voltage difference between the upper voltage supply node 144 and the lower voltage supply node 143 of the low gate driver 140, thus powering the low gate driver 140.

The lower voltage supply node 133 of the high gate driver 130 and a lower terminal 171 of the high capacitor 170 are connected to the source node 113 of the high transistor 110 (and thus to the output node 101). On the other hand, the lower voltage supply node 143 of the low gate driver 140 and a lower terminal 181 of the low capacitor 180 are connected to the source node 123 of the low transistor 120 (and thus to the low-voltage power source).

An intermediate power source (e.g., providing positive 6 volts) is connected to the upper voltage supply node 144 of the low gate driver 140 and to an upper terminal 182 of the low capacitor 180 via a power terminal 104. Accordingly, this intermediate power source provides charge to the low capacitor 180 and to the low gate driver 140 so that the low gate driver 140 can consistently control the low transistor 120. For example, in the case of the low-voltage power source providing ground, and the intermediate power source providing positive 6 volts, the low capacitor 180 would be charged to have a voltage difference of 6 volts between its upper terminal 182 and its lower terminal 181. Thus, in this case, depending on control signals from the controller 160, the low gate driver 140 can provide (to the gate node 121 of the low transistor 120) either the positive 6 volts (e.g., a turn-on voltage) from its upper voltage supply node 144, or ground (e.g., a turn-off voltage) from its lower voltage supply node 143.

On the other hand, the high capacitor 170 is used to provide a stable voltage difference between the upper voltage supply node 134 and the lower voltage supply node 133 of the high gate driver 130, to thereby power the high gate driver 130. When the alternating signal is supplied to the output node 101, this alternating signal is also provided to the lower voltage supply node 133 of the high gate driver 130. This is fine as long as the voltage at the upper voltage supply node 134 also alternates in like fashion so as to maintain the proper voltage difference between the upper voltage supply node 134 and the lower voltage supply node 133 of the high gate driver 130. This is accomplished via the high capacitor 170, and by providing charge to the upper terminal 172 of the high capacitor 170 via a third power transistor 190 connected in diode configuration with a forward-biased direction from the intermediate power source to the upper terminal 172 of the high capacitor 170.

Specifically, the drain node 192 of the third power transistor 190 is connected to the upper terminal 172 of the high capacitor 170, and the source node 193 of the third power transistor 190 is connected to the upper terminal 182 of the low capacitor 180. Further, the third power transistor 190 is connected such that the source node 193 functions as an anode of a diode, and such that the drain node 192 functions as a cathode of a diode. That is, the third power transistor 190 functions as a diode. Further, since the third power transistor 190 is a power transistor, it has a high reverse breakdown voltage of, for example, hundreds of volts or higher.

There are multiple ways that the third power transistor 190 could be connected in "diode configuration". For example, in FIG. 1, the gate node 191 of the third power transistor 190 is connected to the source node 193 of the third power transistor 190, thereby showing one way that the third power transistor 190 may be connected in diode configuration. The functionality of the switching circuit 100 will be described as though the third power transistor 190 is connected as illustrated in FIG. 1.

In operation, when the voltage at the drain node 192 of the third power transistor 190 is at least a threshold voltage of the third power transistor 190 below the voltage at the source node 192 of the third power transistor 190, the third power transistor 190 turns on and allows charge to flow from the intermediate power source to the upper terminal 172 of the high capacitor 170. As an example only, this may occur during "switching deadtime" when each of the high transistor 110 and the low transistor 120 are off, as will be explained later with respect to FIG. 2.

On the other hand, when the voltage at the drain node 192 is not at least the threshold voltage below the voltage at the source node 193 of the third power transistor 190, the third power transistor 190 blocks current from flowing from the intermediate power source to the upper terminal 172 of the high capacitor 170. In fact, the third power transistor 190 is even able to block current from flowing when the voltage at the drain node 192 is hundreds of volts higher than the voltage at the source node 193.

As previously expressed, each of the high transistor 110, the low transistor 120 and the third power transistor 190 are power transistors that are capable of withstanding voltage differences of hundreds of volts or more (while off) between their respective drain nodes and source nodes. This may be accomplished by having each of the high transistor 110, the low transistor 120 and the third power transistor 190 be made of semiconductor materials (e.g., Gallium-Nitride, Silicon-Carbide, or Gallium-Arsenide) that allow for high voltage differences. Further, each of the high transistor 110, the low transistor 120 and the third power transistor 190 may be made of the same semiconductor materials, and thus may also be constructed monolithically on portions of the same epitaxial stack. In fact, the third power transistor 190 may be a finger transistor of one of either of the high transistor 110 or the low transistor 120. In some embodiments, other components of the circuit 100 (e.g., the high gate driver 130, the low gate driver 140, the high capacitor 170 and the low capacitor 180) may also be constructed on the same epitaxial stack. Accordingly, the switching circuit 100 (or at least portions of the switching circuit 100) may be constructed monolithically on the same epitaxial stack, and therefore may be compact, while allowing for the switching circuit 100 to be used in high-power applications.

To explain in greater detail how and when charge is provided to the upper terminal 172 of the high capacitor 170 via the third power transistor 190, the operation of the switching circuit 100 will now be explained with respect to FIG. 2. FIG. 2 illustrates a signal diagrams chart 200, which shows an example of signals representing voltages at various locations in the switching circuit 100.

Four signals 201, 202, 203 and 204 are illustrated, which are provided merely by way of example. The horizontal axis represents time passing from left to right, where the same horizontal position in each of the four signals 201, 202, 203 and 204 represents the same time. The vertical axis for each respective signal 201, 202, 203 and 204 represents the amplitude of the respective signal. The time is divided into time periods T1 through T10.

Signal 201 represents the gate control voltage that the high gate driver 130 outputs to the gate node 111 of the high transistor 110. When signal 201 is high (e.g., approximately positive 6 volts, see time periods T3 and T7), the high transistor 110 is on, whereas when the signal 201 is low (e.g., approximately zero volts, see time periods T1, T2, T4, T5, T6, T8, T9 and T10), the high transistor 110 is off. Similarly signal 202 represents the gate control voltage that the low gate driver 140 outputs to the gate node 121 of the low transistor 120. When signal 202 is high (see time periods T1, T5 and T9), the low transistor 120 is on, whereas when the signal 202 is low (see time periods T2, T3, T4, T6, T7, T8 and T10), the low transistor 120 is off. Note that each of the high transistor 110 and the low transistor 120 are off in time periods T2, T4, T6, T8 and T10. These time periods where both of the high transistor 110 and the low transistor 120 are off is called herein "switching deadtime". Recall that it is in this switching deadtime that charging of the high capacitor 170 may occur.

Signal 203 represents the voltage at the output node 101. The signal 204 represents the voltage at the upper terminal 172 of the high capacitor 170. For purposes of explanation, suppose that each of the high capacitor 170 and the low capacitor 180 have been charged prior to time T1 to have a voltage difference of approximately 6 volts between their respective upper terminals and lower terminals. Also, suppose that the third power transistor 190 has a gate-to-drain threshold voltage of approximately 2 volts. Further, suppose that the high-voltage power source provides positive 400 volts, that the low-voltage power source provides ground, and that the intermediate power source provides positive 6 volts. However, the principles described herein are not limited to the voltages provided by power sources connected to the circuit 100, and are not limited to the threshold voltages of the transistors 110, 120 and 190.

In time period T1, the high transistor 110 is off (due to the low signal 201), and the low transistor 120 is on (due to the high signal 202). Thus, the output node 101 is provided with approximately zero volts (see signal 203) from the low-voltage power source via the low transistor 120. Since the high capacitor 170 has been charged to have a voltage difference of approximately 6 volts, and the lower terminal 171 of the high capacitor 170 is at approximately zero volts, the upper terminal 172 of the high capacitor 170 is at approximately positive 6 volts (see signal 204). Thus, in time period T1, the voltage at the drain node 192 and the voltage at the connected gate node 191 and source node 193 are approximately the same, and the third power transistor 190 is off. This repeats for time periods T5 and T9.

In time period T2, the high transistor 110 remains off (due to the low signal 201), and the low transistor 120 turns off (due to the low signal 202). In this case, even though the output node 101 is not provided with either the high voltage or the low voltage, a component or circuit (not shown) connected to the output node 101 continues to draw current away from the output node 101. This causes the voltage at the output node 101 to drop to approximately negative 2 volts (see signal 203). This drop in voltage at the output node 101 is limited by the gate-to-drain threshold voltage (e.g., 2 volts) of the low transistor 120. That is, if the voltage at the output node 101 drops below the gate-to-drain threshold voltage of the low transistor 120, the low transistor 120 turns on, and just enough charge is provided to the output node 101 via the low transistor 120 to keep the output node 101 stable at approximately negative 2 volts.

In any case, since the voltage at the lower terminal 171 of the high capacitor 170 drops by approximately 2 volts, this also causes a corresponding voltage drop at the upper terminal 172, thus causing the voltage at the upper terminal 172 to drop from 6 volts to approximately 4 volts (see signal 204 in time T2). Accordingly, the voltage at the upper terminal 172 of the high capacitor 170, and thus the voltage at the drain node 192, drops to approximately the gate-to-drain threshold voltage below the voltage at the source node 193, and the third power transistor 190 turns on just enough to allow some current flow to maintain the voltage at the upper terminal 172 at 4 volts in this example. Thus, in time period T2, which is a period of switching deadtime, charge is provided from the intermediate power source to the upper terminal 172 of the high capacitor 170 via the third power transistor 190. This repeats for time periods T6 and T10.

In time period T3, the low transistor 120 remains off (due to low signal 202), and the high transistor 110 turns on (due to high signal 201). Thus, the output node 101 is provided with positive 400 volts (see signal 203) from the high-voltage power source via the high transistor 110. Since the high capacitor 170 has been charged to have the voltage difference of approximately 6 volts, this causes the upper terminal 172 of the high capacitor 170 to rise to approximately positive 406 volts (see signal 204). Thus, the voltage at the drain node 193 of the third power transistor 190 is approximately 400 volts higher than the voltage at the source node 192 of the third power transistor 190, and thus the third power transistor 190 is off, and heavily reverse-biased. Accordingly, in time period T3, the third power transistor 190 blocks current flow, and protects the switching circuit 100. This repeats for time period T7.

In time period T4, the low transistor 120 remains off (due to low signal 202), and the high transistor turns off (due to low signal 201). In this case, even though the output node 101 is not provided with either of the high voltage or the low voltage, the component or circuit (not shown) connected to the output node 101 continues to draw current away from the output node 101. If this current draw is significant enough, the switching circuit 100 will behave similarly in time period T4 as it did in time period T2, and the voltage at the output node 101 will again drop to be a few volts below ground (see signal 203). In this case, the voltage at the upper terminal 172 of the high capacitor 170, and thus the voltage at the drain node 192 of the third power transistor 190, may again drop to be at least the threshold voltage below the voltage at the source node 193 of the power transistor 190. Thus, the third power transistor 190 may again turn on and allow charge to be provided from the intermediate power source to the upper terminal 172 of the capacitor 170. This repeats for time period T8.

As a side note, the voltage at the output node 101 would have just been at approximately 400 volts provided by the high-voltage power source in time period T3. Thus, it may take more time for the voltage at the output node 101 to drop all the way to negative 2 volts. Accordingly, it may be less likely that the current drawn away from the output node 101 in time period T4 would cause the voltage at the output node 101 to drop all the way to negative 2 volts in the given time period. Thus, it may be less likely for the third power transistor 190 to turn on in time period T4, as compared to in time period T2. Of course, the likelihood of the output node 101 dropping all the way to negative 2 volts would increase the longer the deadtime of time period T4 is allowed to occur.

In any case, as shown in FIG. 1 and FIG. 2, the switching circuit 100 ensures that the high capacitor 170 is sufficiently charged during the deadtime time periods T2, T4, T6, T8 and T10. Thus, the switching circuit 100 allows for consistent charge to be supplied to the high gate driver 130 and therefore to the gate node 111 of the high transistor 110. Further, using the third power transistor 190 in diode configuration to achieve such recharging of the high capacitor 170 prevents damage to the switching circuit 100, thus allowing the switching circuit 100 to operate at high voltages and high currents. Also, much of the switching circuit 100 may be implemented monolithically, thus allowing the switching circuit 100 to be compact.

LITERAL SUPPORT SECTION

Clause 1. A switching circuit for providing an alternating signal on a switching node, the switching circuit comprising: a first power transistor having a gate node that controls whether current flows between a drain node and a source node of the first power transistor, the first power transistor formed at least in part of a first portion of an epitaxial stack; a first gate driver having an output node connected to the gate node of the first power transistor, having a first voltage supply node connected to the source node of the first power transistor, and having a second voltage supply node; a first capacitor connected between the first voltage supply node of the first gate driver and the second voltage supply node of the first gate driver; a second power transistor having a gate node that controls whether current flows between a drain node and a source node of the second power transistor, the drain node of the second power transistor being connected to the source node of the first power transistor, the switching node being connected between the source node of the first power transistor and the drain node of the second power transistor, the second power transistor formed at least in part of a second portion of the epitaxial stack; a second gate driver having an output node connected to the gate node of the second power transistor, having a first voltage supply node connected to the source node of the second power transistor, and having a second voltage supply node; a second capacitor connected between the first voltage supply node of the second gate driver and the second voltage supply node of the second gate driver; and a third power transistor having a gate node that controls whether current flows between a drain node and a source node of the third power transistor, the drain node of the third power transistor being connected to the second voltage supply node of the first gate driver, the source node of the third power transistor being connected to the second voltage supply node of the second gate driver, the third power transistor being in diode-configuration so as to have a forward-biased direction from the source node of the third power transistor to the drain node of the third power transistor, the third power transistor formed at least in part of a third portion of the epitaxial stack.

Clause 2. The switching circuit in accordance with Clause 1, the third power transistor being in the diode-configuration by having the gate node of the third power transistor connected to the source node of the third power transistor.

Clause 3. The switching circuit according to Clause 1, the epitaxial stack being epitaxially grown on a substrate in an epitaxial growth direction, the epitaxial stack comprising a channel layer and a barrier layer epitaxially grown on the channel layer, an interface of the barrier layer and the channel layer defining a heterojunction that induces a twodimensional electron gas (2DEG) within the channel layer, the 2DEG extending perpendicular to the epitaxial growth direction.

Clause 4. The switching circuit according to Clause 3, the channel layer comprised of Gallium-Nitride (GaN), and the barrier layer comprised of Aluminum-Gallium-Nitride (AlGaN).

Clause 5. The switching circuit according to Clause 1, the circuit further comprising: a first power terminal connected to the drain node of the first power transistor, the first power terminal configured to received power from a first external power source; a second power terminal connected to the source node of the second power transistor, the second power terminal configured to receive power from a second external power source; and a third power terminal connected to the source node of the third power transistor, the third power terminal configured to receive power from a third external power source.

Clause 6. The switching circuit according to Clause 5, the first external power source providing at least positive 50 volts.

Clause 7. The switching circuit according to Clause 5, the second external power source providing ground.

Clause 8. The switching circuit according to Clause 5, the third external power source configured to provide a gate voltage to the second voltage supply node of the first gate driver, and configured to provide a portion of the gate voltage to the second voltage supply node of the second gate driver via the third power transistor.

Clause 9. The switching circuit according to Clause 8, the gate voltage being between positive 4.5 volts and positive 7 volts.

Clause 10. The switching circuit according to Clause 5, the circuit further comprising a controller configured to control each of the first gate driver and the second gate driver, such that: during a first time period, the first power transistor is off, and the second power transistor is on, such that the switching node receives power from the second external power source via the second power transistor; during a second time period, the first power transistor is off, and the second power transistor is off, such that current is drawn away from the switching node via a component connected to the switching node, thereby causing the voltage at the switching to decrease, and thereby causing the voltage at the drain node of the third power transistor to decrease to be at least a threshold voltage of the third power transistor below the voltage present at the connected gate node and the source node of the third power transistor, such that the third power transistor allows current to flow from the source node to the drain node of the third power transistor, thereby replenishing charge to the first capacitor; during a third time period, the second power transistor is off, and the first power transistor is on, such that the switching node receives power from the first external power source via the first power transistor, and such that the third power transistor blocks current from flowing from the drain node to the source node of the third power transistor; and during a fourth time period, the second power transistor is off, and the first power transistor is off, such that current is drawn away from the switching node via the component connected to the switching node, thereby causing the voltage at the switching node to decrease, and thereby causing the voltage at the drain node of the third power transistor to decrease to be at least a threshold voltage of the third power transistor below the voltage present at the connected gate node and the source node of the third power transistor, such that the third power transistor allows current to flow from the source node to the drain node of the third power transistor, thereby replenishing charge to the first capacitor.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed is:

1. A switching circuit for providing an alternating signal on a switching node, the switching circuit comprising:
    a first power transistor having a gate node that controls whether current flows between a drain node and a source node of the first power transistor, the first power transistor formed at least in part of a first portion of an epitaxial stack;
    a first gate driver having an output node connected to the gate node of the first power transistor, having a first voltage supply node connected to the source node of the first power transistor, and having a second voltage supply node;
    a first capacitor connected between the first voltage supply node of the first gate driver and the second voltage supply node of the first gate driver;
    a second power transistor having a gate node that controls whether current flows between a drain node and a source node of the second power transistor, the drain node of the second power transistor being connected to the source node of the first power transistor, the switching node being connected between the source node of the first power transistor and the drain node of the second power transistor, the second power transistor formed at least in part of a second portion of the epitaxial stack;
    a second gate driver having an output node connected to the gate node of the second power transistor, having a first voltage supply node connected to the source node of the second power transistor, and having a second voltage supply node;
    a second capacitor connected between the first voltage supply node of the second gate driver and the second voltage supply node of the second gate driver; and
    a third power transistor having a gate node that controls whether current flows between a drain node and a source node of the third power transistor, the drain node of the third power transistor being connected to the second voltage supply node of the first gate driver, the source node of the third power transistor being connected to the second voltage supply node of the second gate driver, the third power transistor being in diode-configuration so as to have a forward-biased direction from the source node of the third power transistor to the drain node of the third power transistor, the third power transistor formed at least in part of a third portion of the epitaxial stack;
a first power terminal connected to the drain node of the first power transistor, the first power terminal configured to received power from a first external power source;
a second power terminal connected to the source node of the second power transistor, the second power terminal configured to receive power from a second external power source; and
a third power terminal connected to the source node of the third power transistor, the third power terminal configured to receive power from a third external power source; and
a controller configured to control each of the first gate driver and the second gate driver, such that:
during a first time period, the first power transistor is off, and the second power transistor is on, such that the switching node receives power from the second external power source via the second power transistor;
during a second time period, the first power transistor is off, and the second power transistor is off, such that current is drawn away from the switching node via a component connected to the switching node, thereby causing the voltage at the switching to decrease, and thereby causing the voltage at the drain node of the third power transistor to decrease to be at least a threshold voltage of the third power transistor below the voltage present at the connected gate node and the source node of the third power transistor, such that the third power transistor allows current to flow from the source node to the drain node of the third power transistor, thereby replenishing charge to the first capacitor;
during a third time period, the second power transistor is off, and the first power transistor is on, such that the switching node receives power from the first external power source via the first power transistor, and such that the third power transistor blocks current from flowing from the drain node to the source node of the third power transistor; and
during a fourth time period, the second power transistor is off, and the first power transistor is off, such that current is drawn away from the switching node via the component connected to the switching node, thereby causing the voltage at the switching node to decrease, and thereby causing the voltage at the drain node of the third power transistor to decrease to be at least a threshold voltage of the third power transistor below the voltage present at the connected gate node and the source node of the third power transistor, such that the third power transistor allows current to flow from the source node to the drain node of the third power transistor, thereby replenishing charge to the first capacitor.

2. The switching circuit in accordance with claim 1, the third power transistor being in the diode-configuration by having the gate node of the third power transistor connected to the source node of the third power transistor.

3. The switching circuit according to claim 1, the first external power source providing at least positive 50 volts.

4. The switching circuit according to claim 1, the second external power source providing ground.

5. The switching circuit according to claim 1, the third external power source configured to provide a gate voltage to the second voltage supply node of the first gate driver, and configured to provide a portion of the gate voltage to the second voltage supply node of the second gate driver via the third power transistor.

6. The switching circuit according to claim 5, the gate voltage being between positive 4.5 volts and positive 7 volts.

7. A method for controlling a switching circuit to provide an alternating signal on a switching node, the switching circuit comprising: a first power transistor having a gate node that controls whether current flows between a drain node and a source node of the first power transistor, the first power transistor formed at least in part of a first portion of an epitaxial stack; a first gate driver having an output node connected to the gate node of the first power transistor, having a first voltage supply node connected to the source node of the first power transistor, and having a second voltage supply node; a first capacitor connected between the first voltage supply node of the first gate driver and the second voltage supply node of the first gate driver; a second power transistor having a gate node that controls whether current flows between a drain node and a source node of the second power transistor, the drain node of the second power transistor being connected to the source node of the first power transistor, the switching node being connected between the source node of the first power transistor and the drain node of the second power transistor, the second power transistor formed at least in part of a second portion of the epitaxial stack; a second gate driver having an output node connected to the gate node of the second power transistor, having a first voltage supply node connected to the source node of the second power transistor, and having a second voltage supply node; a second capacitor connected between the first voltage supply node of the second gate driver and the second voltage supply node of the second gate driver; a third power transistor having a gate node that controls whether current flows between a drain node and a source node of the third power transistor, the drain node of the third power transistor being connected to the second voltage supply node of the first gate driver, the source node of the third power transistor being connected to the second voltage supply node of the second gate driver, the third power transistor being in diode-configuration so as to have a forward-biased direction from the source node of the third power transistor to the drain node of the third power transistor, the third power transistor formed at least in part of a third portion of the epitaxial stack; a first power terminal connected to the drain node of the first power transistor, the first power terminal configured to received power from a first external power source; a second power terminal connected to the source node of the second power transistor, the second power terminal configured to receive power from a second external power source; and a third power terminal connected to the source node of the third power transistor, the third power terminal configured to receive power from a third external power source, the method comprising:
during a first time period, the first power transistor is off, and the second power transistor is on, such that the switching node receives power from the second external power source via the second power transistor;
during a second time period, the first power transistor is off, and the second power transistor is off, such that current is drawn away from the switching node via a component connected to the switching node, thereby causing the voltage at the switching to decrease, and thereby causing the voltage at the drain node of the third power transistor to decrease to be at least a threshold voltage of the third power transistor below the voltage present at the connected gate node and the source node of the third power transistor, such that the third power transistor allows current to flow from the source node to the drain node of the third power transistor, thereby replenishing charge to the first capacitor;

during a third time period, the second power transistor is off, and the first power transistor is on, such that the switching node receives power from the first external power source via the first power transistor, and such that the third power transistor blocks current from flowing from the drain node to the source node of the third power transistor; and during a fourth time period, the second power transistor is off, and the first power transistor is off, such that current is drawn away from the switching node via the component connected to the switching node, thereby causing the voltage at the switching node to decrease, and thereby causing the voltage at the drain node of the third power transistor to decrease to be at least a threshold voltage of the third power transistor below the voltage present at the connected gate node and the source node of the third power transistor, such that the third power transistor allows current to flow from the source node to the drain node of the third power transistor, thereby replenishing charge to the first capacitor.

* * * * *